United States Patent
Kim et al.

(10) Patent No.: US 8,603,249 B2
(45) Date of Patent: Dec. 10, 2013

(54) LIFT PIN DRIVING DEVICE AND MANUFACTURING APPARATUS HAVING SAME

(75) Inventors: Jong Sun Kim, Seongnam-si (KR); Chang Keun Lee, Seoul (KR); Won Ki Jeong, Seongnam-si (KR)

(73) Assignee: LG Electronics Inc., Seoul (KR)

( * ) Notice: Subject to any disclaimer, the term of this patent is extended or adjusted under 35 U.S.C. 154(b) by 1462 days.

(21) Appl. No.: 11/874,379

(22) Filed: Oct. 18, 2007

(65) Prior Publication Data

US 2008/0134814 A1 Jun. 12, 2008

(30) Foreign Application Priority Data

Dec. 11, 2006 (KR) .......................... 10-2006-0125286
Dec. 11, 2006 (KR) .......................... 10-2006-0125288

(51) Int. Cl.
*C23C 16/00* (2006.01)
*C23C 16/50* (2006.01)
*C23F 1/00* (2006.01)
*H01L 21/306* (2006.01)

(52) U.S. Cl.
USPC .. 118/728; 118/715; 156/345.51; 156/345.54

(58) Field of Classification Search
USPC ................. 118/715, 728, 729, 730, 731, 732; 156/345.51, 345.52, 345.53, 345.54, 156/345.55
See application file for complete search history.

(56) References Cited

U.S. PATENT DOCUMENTS

| | | | | |
|---|---|---|---|---|
| 4,362,062 A | * | 12/1982 | Peterson | 73/862.453 |
| 5,421,894 A | * | 6/1995 | Lei et al. | 118/725 |
| 6,743,132 B2 | * | 6/2004 | Serkh | 474/136 |
| 2004/0087400 A1 | * | 5/2004 | Youn | 474/117 |
| 2005/0173396 A1 | * | 8/2005 | Ooshima et al. | 219/390 |

FOREIGN PATENT DOCUMENTS

| | | |
|---|---|---|
| JP | 06-23924 | 3/1994 |
| JP | 1999-097324 | 4/1999 |
| JP | 2000-176876 | 6/2000 |
| KR | KO 20-1998-0037878 | 9/1998 |
| KR | KO 10-1998-086713 | 12/1998 |

OTHER PUBLICATIONS

Korean Office Action for Application No. 10-2006-0125286 dated Jun. 7, 2013.
Korean Office Action for Application No. 10-2006-0125288 dated Jun. 10, 2013.

* cited by examiner

*Primary Examiner* — Maureen Gramaglia
*Assistant Examiner* — Tiffany Nuckols
(74) *Attorney, Agent, or Firm* — KED & Associates, LLP

(57) ABSTRACT

A lift pin driving device and a manufacturing apparatus having the device are provided. The device includes drive unit including a single drive motor that drives a pin plate, a plurality of timing belts and a plurality of pulleys. The pin plate, which supports a plurality of lift pins thereon, is moved by the pulleys, operated in conjunction with the motor through the timing belts. A tensioner controls a tension of the timing belts. The tensioner may be controlled to provide precise rectilinear movement without leaning, and to prevent the timing belts from sagging. The device efficiently controls the tension of the timing belts and allows the lift pins to be precisely moved upwards or downwards such that a substrate positioned thereon may maintain a horizontal position while being moved upwards or downwards.

18 Claims, 19 Drawing Sheets

LIFT PIN DRIVING DEVICE AND MANUFACTURING APPARATUS HAVING SAME

This application claims the benefit of Korean Patent Application Nos. 10-2006-0125286 filed on Dec. 11, 2006; and 10-2006-0125288 filed Dec. 11, 2006, the entirety of which are incorporated herein by reference.

BACKGROUND

1. Field

This relates to lift pin modules and, in particular, to lift pin modules that move a plurality of lift pins upwards or downwards at the same time, and a manufacturing apparatus having such a module.

2. Background

Similar structures for transferring semiconductor wafers or glass substrates to or from a stage for processing may be used in a semiconductor manufacturing apparatus and in a Flat Panel Display (FPD) manufacturing apparatus. As an example, FPDs (Flat Panel Displays) may include LCDs (Liquid Crystal Displays), PDPs (Plasma Display Panels), OLEDs (Organic Light Emitting Diodes), and other such devices. A manufacturing apparatus used for manufacturing these types of devices may include a plurality of vacuum treatment devices, such as a load lock chamber, a transfer chamber and a process chamber, for treating the surface of a substrate.

The load lock chamber receives raw substrates from the outside and distributes processed substrates to the outside, while alternating between an atmospheric state and a vacuum state. The transfer chamber may include a transfer robot for transferring the substrates between chambers, thus feeding raw substrates from the load lock chamber to the process chamber and returning processed substrates from the process chamber to the load lock chamber. The process chamber may apply respective layers on the substrates or etch the substrates using plasma or thermal energy in a vacuum. A plurality of lift pins may be used to position the substrate for transfer into and out of the process chamber.

BRIEF DESCRIPTION OF THE DRAWINGS

The embodiments will be described in detail with reference to the following drawings in which like reference numerals refer to like elements wherein.

DETAILED DESCRIPTION

Figure 1:
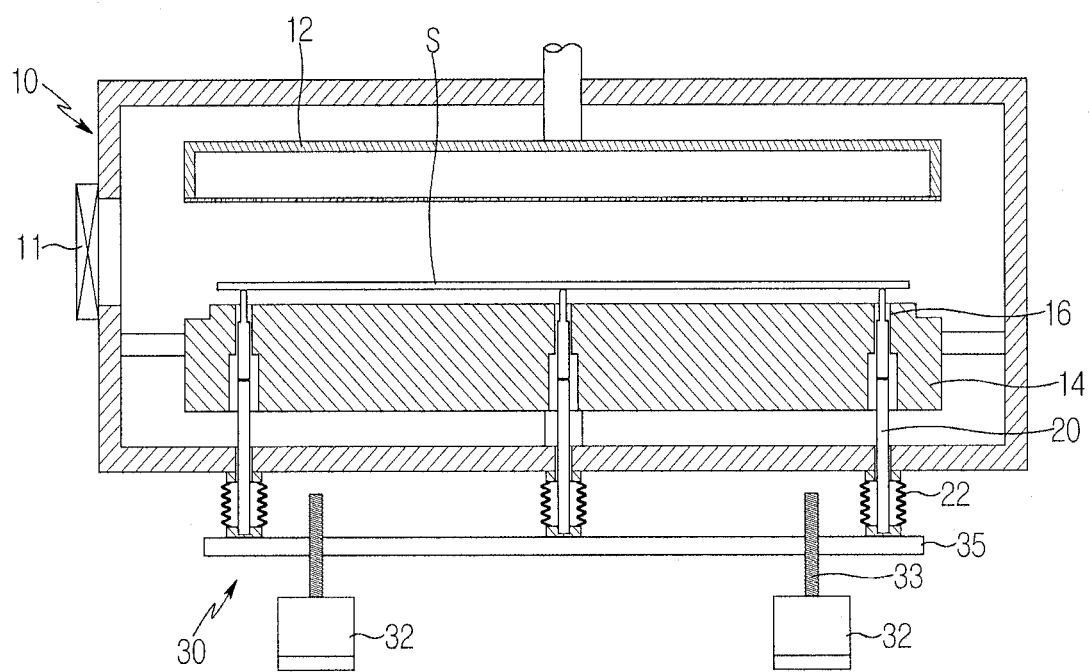
FIG. 1 is a cross-sectional view of an exemplary process chamber and lift pin driving device.

Reference will now be made to examples of embodiments which are illustrated in the accompanying drawings. Wherever possible, the same reference numerals will be used throughout the drawings and the description to refer to similar parts.

The process chamber shown in FIG. 1 may include a chamber body 10 having a gate 11 capable of creating a vacuum state in the process chamber so that a process can be executed in a vacuum. The process chamber may also include an upper electrode assembly 12 provided in an upper portion of the chamber body 10, and a lower electrode assembly 14 provided below the upper electrode assembly 12 to support a substrate S thereon. The upper electrode assembly 12 may include a shower head (not shown) for spraying process gas onto the substrate S.

The lower electrode assembly 14 may include a plurality of lift pins 20 for moving the substrate S in vertical directions so as to position the substrate S for transfer to or from the assembly 14. The assembly 14 may include a plurality of pinholes 16 through which the lift pins 20 may movably pass. Thus, the lift pins 20 may be moved upwards or downwards within the respective pinholes 16, thereby also moving the substrate S positioned thereon. The lift pins 20 and pin holes 16 may be surrounded by bellows 22 to seal the openings into the chamber body 10.

In other words, when a substrate S has been transferred from the outside into the chamber body 10 by a transfer unit, the lift pins 20 may be raised to a predetermined height to receive the substrate S. After the transfer unit has deposited the substrate S and moved out of the chamber body 10, the lift pins 20 may be lowered to lower the substrate S onto the upper surface of the lower electrode assembly 14. To discharge the processed substrate S outside the chamber body 10, the lift pins 20 lift the substrate S, thus positioning the substrate S for transfer to the outside.

Figure 2:
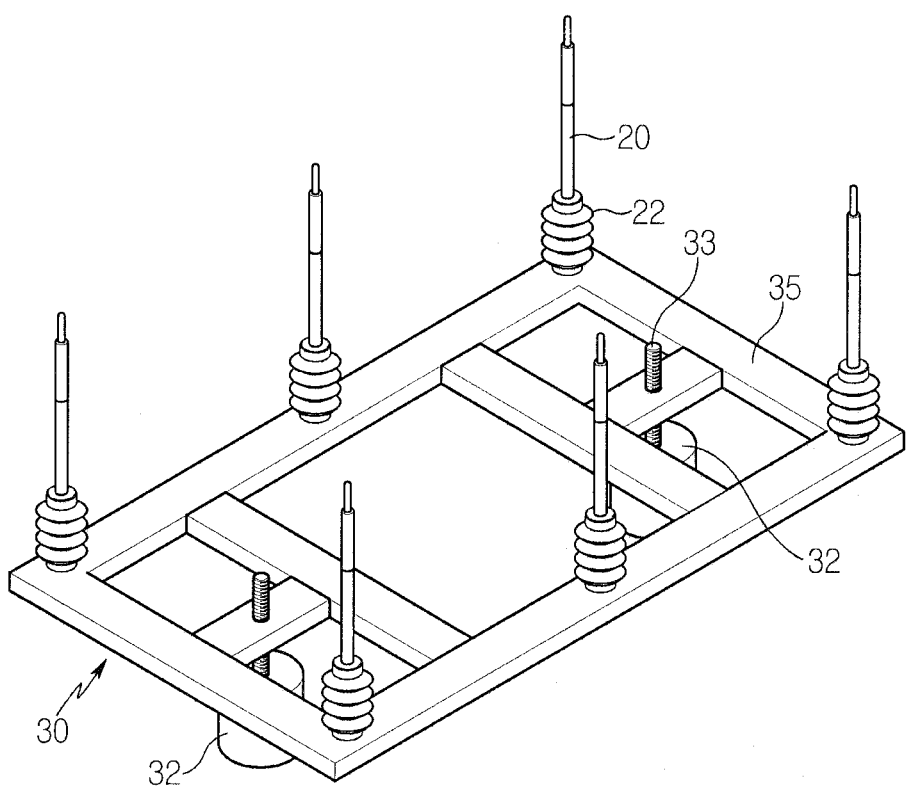
FIG. 2 is a perspective view of the lift pin driving device shown in FIG. 1.

The lift pins 20 may be moved by a lift pin driving device 30, which is configured to move the plurality of lift pins 20 at the same time. The lift pin driving device 30 may include a pin plate 35 positioned below the chamber body 10, and having lower ends of the plurality of lift pins 20 fixed thereto. The lift pin driving device 30 may also include a drive motor 32 and a ball screw 33 to move the pin plate 35 upwards or downwards through a ball screw-type driving method. To provide for stable, uniform movement of the pin plate 35 and the plurality of lift pins 20, the lift pin driving device 30 may include, in certain embodiments, two or more drive motors 32, as shown in FIG. 1 and FIG. 2. As FPD substrates S increase in size, the size of the lift pin driving device 30 also increases. Thus, two drive motors 32 and two ball screws 33 may be provided at opposite ends of the pin plate 35, as shown in the drawings, to uniformly and stably move the pin plate 35 and accommodate a larger substrate S.

When using two drive motors 32, it may be very difficult to synchronize control of the two motors 32 such that the motors 32 can simultaneously move the lift pins 20 to the same height. When the two motors 32 are not precisely controlled, the pin plate 35 may be positioned at an incline, and a phase difference may be generated between the lift pins 20. When a substrate S is loaded or unloaded by the lift pins 20 having such a phase difference, the substrate S may be damaged by the lift pins 20. Thus, it may be difficult to conduct high quality substrate treatment using lift pins 20 having such a phase difference.

A compensation control system may be used to compensate for the control of the motors 32 and/or compensate for the phase difference of the lift pins 20. However, the use of such a compensation control system may complicate the control structure and increase the cost of equipment.

Figure 3:
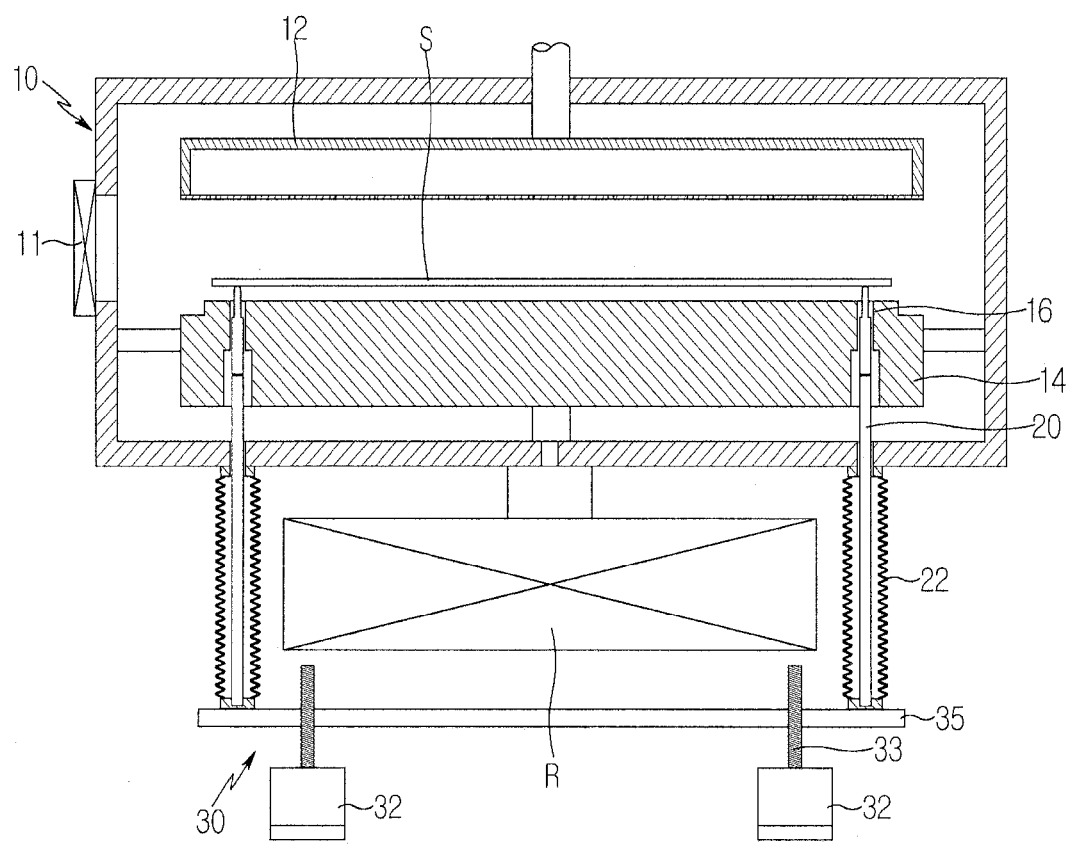
FIG. 3 is a cross-sectional view of another exemplary process chamber and lift pin driving device.

Process chambers may be generally classified into a PE (Plasma Enhanced) type chamber and an RIE (Reactive Ion Etching) type chamber based on the type plasma generation method used. In an RIE type process chamber, an electronic module for applying RF power is installed in the space below the chamber body 10. Thus, it may be difficult to install two drive motors 32 in the space below the chamber body 10 of such an RIE type process chamber. To accommodate two drive motors 32 in the space below the chamber body 10 of an RIE type process chamber, the lift pin driving device 30 may be placed in the space below the chamber body 10 as shown in FIG. 3, so as to accommodate an electronic module, such as a matching box R, beneath the chamber body 10. However, in this situation, the lift pins 20 and the bellows 22 have increased lengths, which may render the lift pin driving device 30 somewhat unstable.

Figure 4:
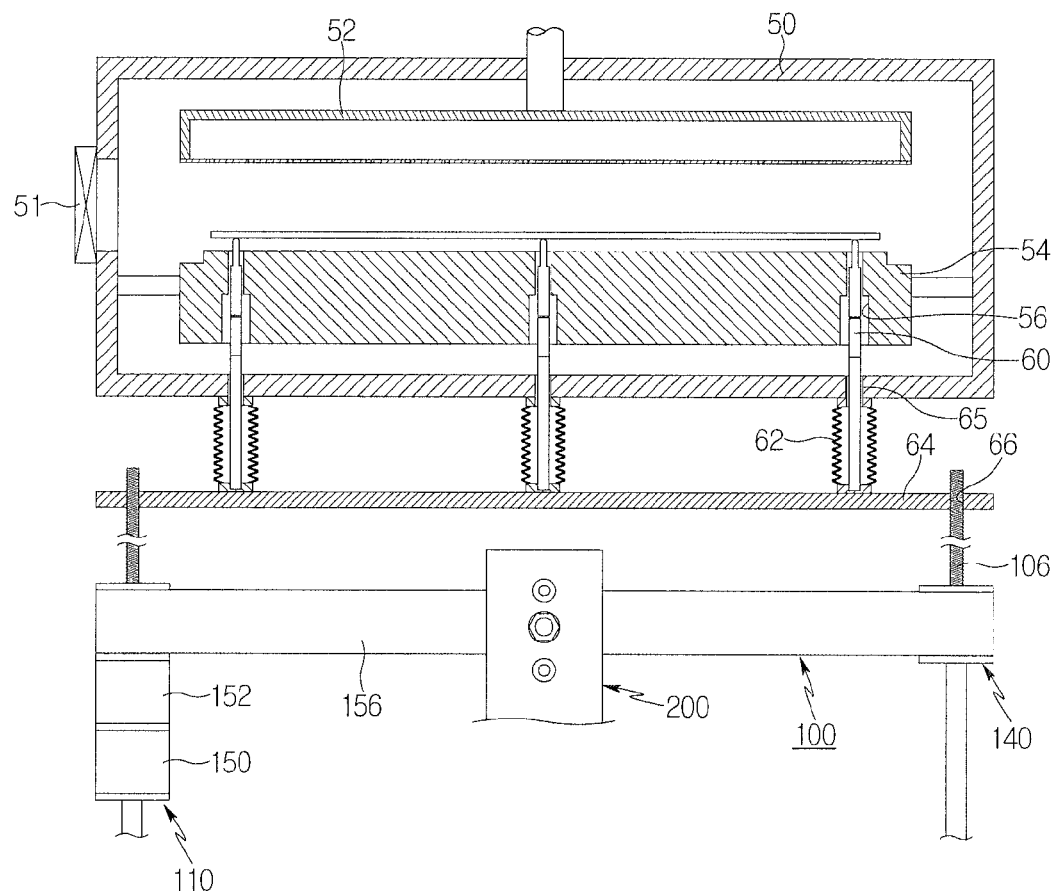
FIG. 4 is a cross-sectional view of a process chamber and a lift pin driving device as embodied and broadly described herein.
Figure 5:
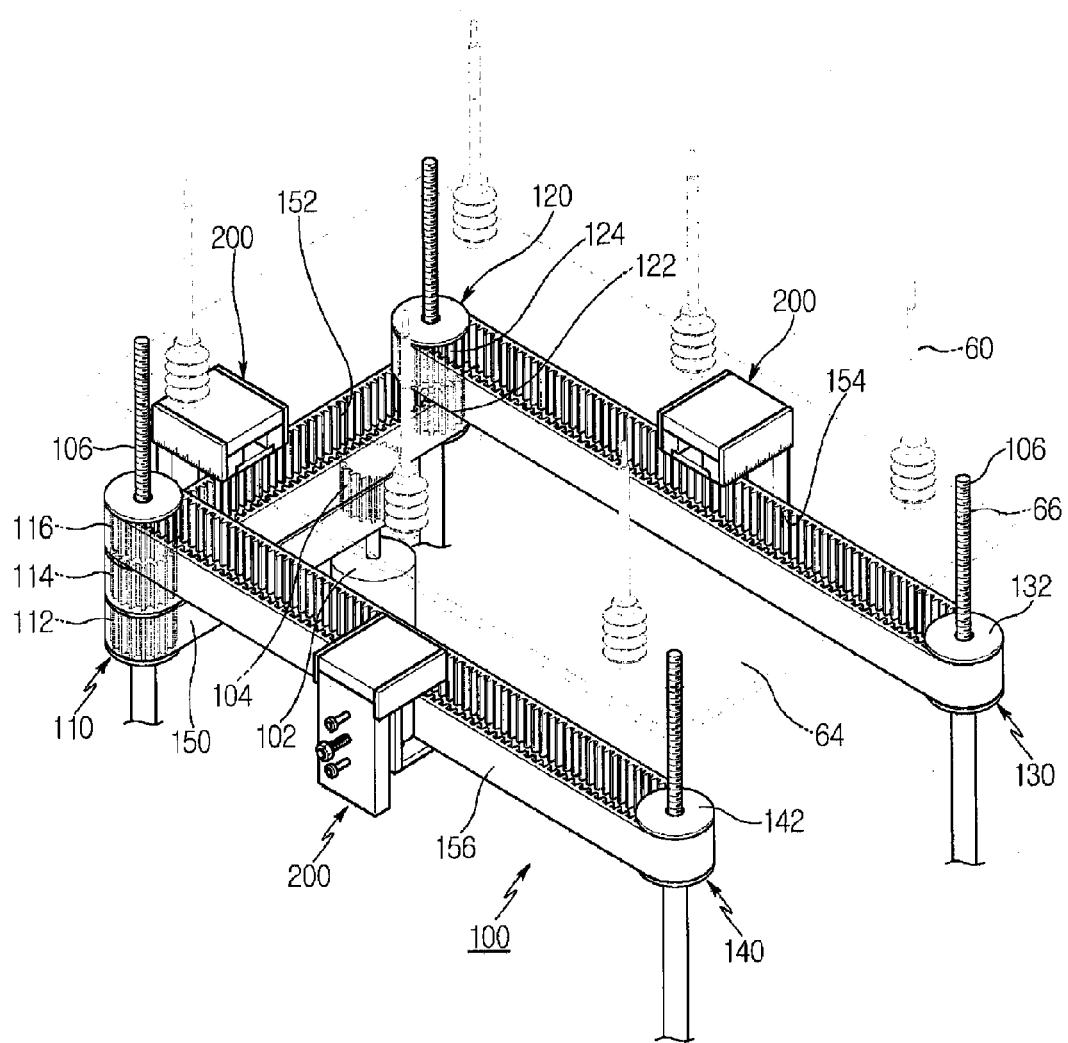
FIG. 5 is a perspective view of the lift pin driving device shown in FIG. 4.
Figure 6:
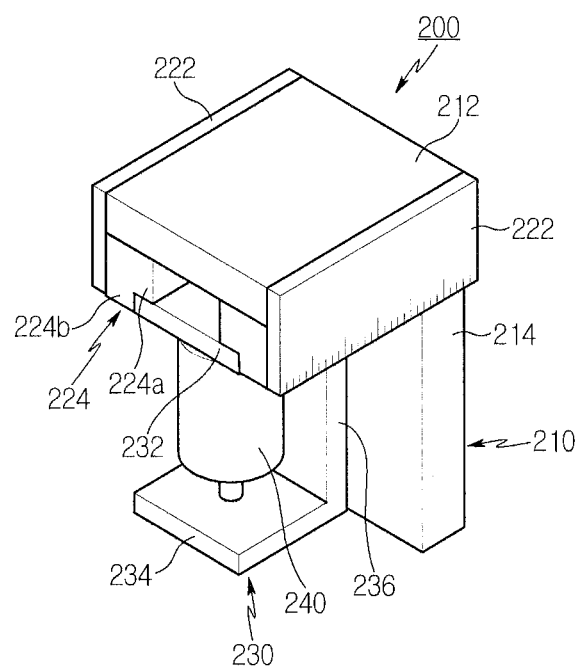
FIG. 6 is a front perspective view of a tensioner used in a lift pin driving device according to an embodiment as broadly described herein.
Figure 7:
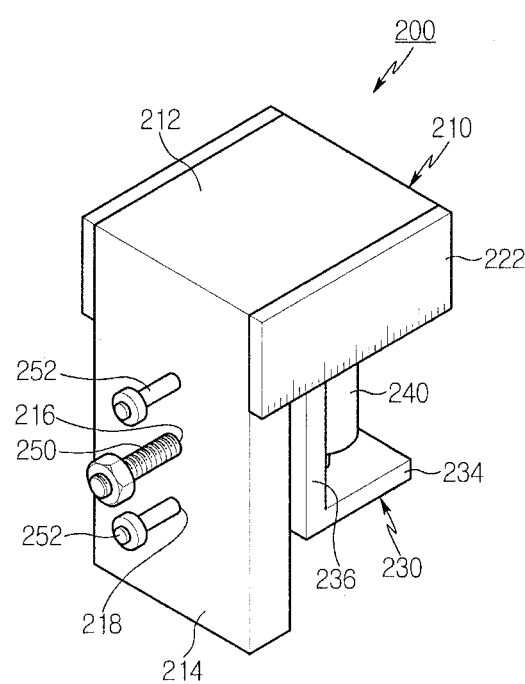
FIG. 7 is a rear perspective view of the tensioner shown in FIG. 6.
Figure 8:
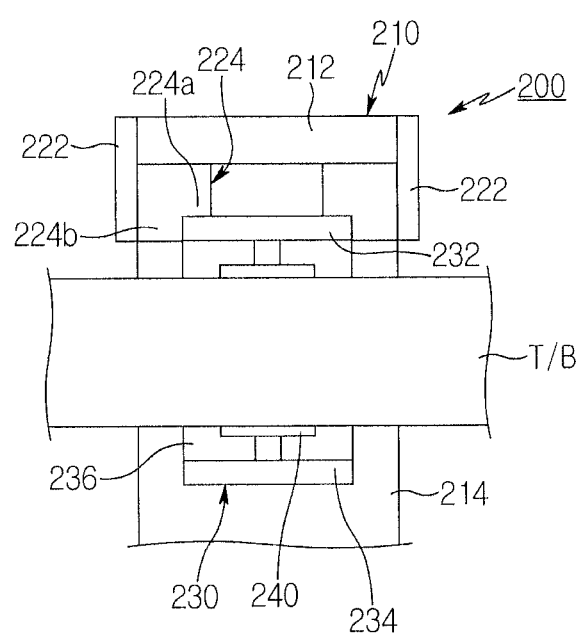
FIG. 8 is a front view of the tensioner shown in FIG. 6.
Figure 9:
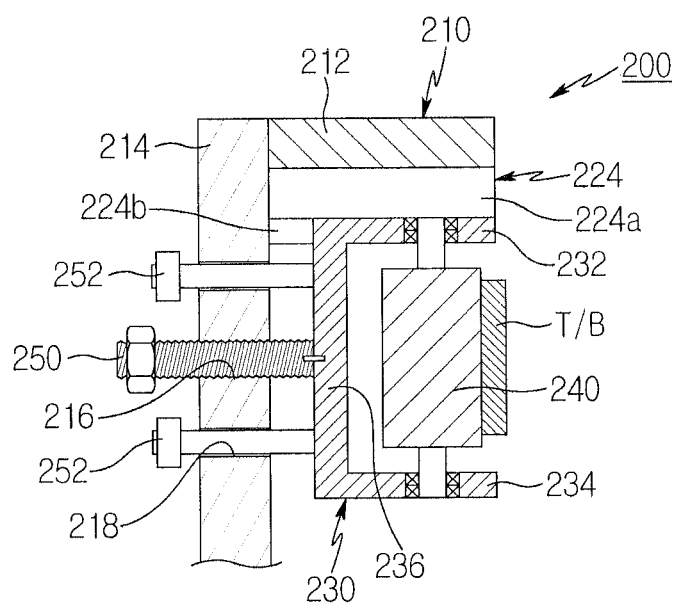
FIG. 9 is a cross-sectional view of the tensioner shown in FIG. 6.

FIGS. 4 and 5 show the construction of a process chamber and a lift pin driving device in accordance with a first embodiment as broadly described herein. The process chamber may include a chamber body 50 in which a surface of a substrate S may be treated in a vacuum, with both an upper electrode assembly 52 and a lower electrode assembly 54 provided in upper and lower portions of the chamber body 50, respectively. The chamber body 50 may also include a gate 51 for receiving and discharging a substrate S. The upper electrode assembly 52 may include a shower head (not shown) for spraying process gas onto an upper surface of the substrate S.

The lower electrode assembly 54 may function as a support unit to support thereon the substrate S, which is subjected to surface treatment in the chamber body 50. A plurality of lift pins 60 may pass vertically through the lower electrode assembly 54 to move the substrate S upwards or downwards to position the substrate S for loading or unloading. The assembly 54 may include a plurality of pinholes 56 that allow the lift pins 60 to pass there through.

A lift pin driving device 100 for moving the lift pins 60 upwards or downwards may be provided in the space below the chamber body 50. The chamber body 50 may include a plurality of pinholes 65, which together with the pinholes 56 form a pin passing unit that allows the lift pins 60 to extend downwards through the lower end of the chamber body 50 so that the lift pins 60 can be operated by the lift pin driving device 100. The lift pins 60 may be surrounded by bellows 62 that seal these openings in the chamber body 50.

The lift pin driving device 100 may include a plurality of timing belts 150, 152, 154 and 156 forming a power transmission unit that rotates a plurality of pulleys 110, 120, 130 and 140 using the rotating force of a single drive motor 102. The rotation of the pulleys 110, 120, 130 and 140 rotates a plurality of ball screws 106 which are vertically coupled to the pulleys 110, 120, 130 and 140 to move a pin plate 64 and the lift pins 60 fixed thereto upwards or downwards.

In the embodiment shown in FIGS. 4 and 5, the power transmission unit is a belt transmission unit driven by a plurality of timing belts 150, 152, 154 and 156. However, it should be understood that the power transmission unit may be configured as another type of power transmission unit, such as, for example, a chain transmission unit.

A plurality of internally threaded holes 66 may extend through the pin plate 64 at locations corresponding to the ball screws 106, such as, for example, at the corners of the pin plate 64. Other locations may also be appropriate. The plurality of ball screws 106 having a predetermined length pass through the respective internally threaded holes 66. Thus, as shown in FIGS. 4 and 5, the pulleys 110, 120, 130 and 140 may be rotatably positioned below the corners of the pin plate 64 and may be connected to neighboring pulleys 110, 120, 130, 140 through timing belts 150, 152, 154 and 156 to form the power transmission unit.

The single drive motor 102 may be located near the first pulley 110, or another one of the pulleys 120, 130 and 140 as appropriate. As shown in FIG. 5, the shaft of the drive motor 102 may be provided with a drive pulley 104. The drive pulley 104 may be connected through the first timing belt 150 to the first pulley 110.

The first pulley 110 may have a three-stage structure, including a first stage pulley 112 connected to the drive pulley 104 by the first timing belt 150, and a second stage pulley 114 and a third stage pulley 116 sequentially positioned above the first stage pulley 112.

The second pulley 120 may have a two-stage structure including a first stage pulley 122 connected to the second stage pulley 114 of the first pulley 110 by the second timing belt 152, and a second stage pulley 124 positioned above the first stage pulley 122. The third pulley 130 may have a single-stage structure including only a first stage pulley 132 connected to the second stage pulley 124 of the second pulley 120 by the third timing belt 154. The fourth pulley 140 may have a single-stage structure including only a first stage pulley 142 connected to the third stage pulley 116 of the first pulley 110 by the fourth timing belt 156.

In the embodiment shown in FIG. 5, the third pulley 130 is not connected to the fourth pulley 140 by a power transmission unit. However, it should be understood that both the third pulley 130 and the fourth pulley 140 may be configured to have multi-stage structures and may be connected to each other using a timing belt, as desired.

The upper surface of the third stage pulley 116 of the first pulley 110, the upper surface of the second stage pulley 124 of the second pulley 120, and the first stage pulleys 132 and 142 of both the third pulley 130 and the fourth pulley 140 may lie in the same plane, so that the upper ends of the ball screws 106, vertically coupled to the upper surfaces of the pulleys 110, 120, 130 and 140, are positioned in the same plane.

When the single drive motor 102 is rotated in one direction, such as, for example, clockwise, the first stage pulley 112 of the first pulley 110, which is connected to the drive pulley 104 by the first timing belt 150, is rotated in the same direction, that is, clockwise.

Thus, both the second stage pulley 114 and the third stage pulley 116, which rotate around the same axis as the first stage pulley 112 of the first pulley 110, rotate in the same direction, that is, clockwise. Therefore, the first stage pulley 122 of the second pulley 120, which is connected to the second stage pulley 114 of the first pulley 110 by the second timing belt 152, is rotated in the same direction, that is, clockwise. Further, the second stage pulley 124, which rotates around the same axis as that of the first stage pulley 122 of the second pulley 120, is rotated in the same direction, that is, clockwise. Thus, the first pulley 110 and the second pulley 120 are rotated in the same direction, that is, clockwise, in conjunction with each other. The first stage pulley 132 of the third pulley 130, which is connected to the second stage pulley 124 of the second pulley 120 by the third timing belt 154, is in turn rotated in the same direction, that is, clockwise. Further, the first stage pulley 142 of the fourth pulley 140, which is connected to the third stage pulley 116 of the first pulley 110 by the fourth timing belt 156, is rotated in the same direction, that is, clockwise.

In brief, the rotation of the single drive motor 102 causes the first pulley 110, the second pulley 120, the third pulley 130 and the fourth pulley 140 to be rotated in the same direction and at the same speed by the timing belts 150, 152, 154 and 156, which form a power transmission unit and connect the pulleys 110, 120, 130 and 140 to each other. Thus, the ball screws 106, which are coupled to the respective pulleys 110, 120, 130 and 140, are rotated at the same speed.

The upper ends of the ball screws 106 are rotated along the internally threaded holes 66 formed in the corners of the pin plate 64 and move the pin plate 64 upwards or downwards. Thus, the plurality of lift pins 60, which installed on the upper surface of the pin plate 64 at regular intervals, may be precisely moved upwards or downwards at the same time through the pinholes 56 and 65 formed in the lower electrode assembly 54 and the chamber body 50.

Over time, the timing belts 150, 152, 154 and 156 may lose their tension, and become loose due to lengthy operation and their material characteristics. Thus, the lift pin driving device 100 may include a tensioner 200 for maintaining a desired tension in the timing belts 150, 152, 154 and 156.

As shown in FIGS. 4 and 5, a plurality of tensioners 200 may be closely placed around the respective timing belts 150, 152, 154 and 156. The tensioners 200 may impose a biasing force on first sides of the timing belts 150, 152, 154 and 156, thus pushing the sides of the timing belts 150, 152, 154 and 156 inwards and maintaining a desired tension.

More specifically, when the timing belts 150, 152, 154 and 156 have different tensions from each other (due to lengthy operation, wear and the like), the rotating speeds of the pulleys 110, 120, 130 and 140, coupled to each other by the timing belts 150, 152, 154 and 156, could become different from each other. In this case, the ball screws 106 would turn at different rates, causing the pin plate 64 to move upwards or downwards without being maintained precisely horizontal, thus causing the substrate S to be moved upwards or downwards without being horizontal. This may result in damage to the substrate and difficulty in conducting high quality substrate treatment.

As shown in FIGS. 6 through 9, the tensioner 200 may include a fixed bracket 210, a movable bracket 230, which may be positioned inside the fixed bracket 210 and may be movable forwards and backwards, a tension control unit for moving the movable bracket 230 forwards and backwards, a guide unit for guiding the movement of the movable bracket 230 such that the movable bracket 230 can be rectilinearly moved without leaning forwards, backwards, rightwards or leftwards, and a tension roller 240, which may be rotatably installed in the movable bracket 230.

The fixed bracket 210 may include a horizontal part 212 and a vertical part 214, which may be integrated to form an inverted L-shaped appearance. The fixed bracket 210 may be securely mounted to a support member (not shown), with the guide unit provided on the horizontal part 212 of the fixed bracket 210.

The guide unit may include a scale 222 having a predetermined height and being provided on each side surface of the horizontal part 212 of the fixed bracket 210. The guide unit may also include guides 224 formed in parallel along opposite sides of a lower surface of the horizontal part 212. The scale 222 may include a graduation on an outer surface thereof. Each of the guides 224 may include a horizontal part 224a and a vertical part 224b, which may be integrated to form an inverted L-shaped appearance.

The movable bracket 230 may include an upper horizontal part 232, a lower horizontal part 234 and a vertical part 236. The upper and lower horizontal parts 232 and 234 and the vertical part 236 may be integrated to have a [-shaped appearance. The upper horizontal part 232 may move rectilinearly along the guides 224 of the guide unit while maintaining close contact both with the lower surfaces of the horizontal parts 224a and the inner surfaces of the vertical parts 224b of the guide 224. Thus, the movable bracket 230 may move rectilinearly without leaning forwards, backwards, rightwards or leftwards.

In other words, the upper horizontal part 232 of the movable bracket 230 maintains close contact with the lower surfaces of the horizontal parts 224a of the two guides 224 of the guide unit, and also maintains close contact with the inner surfaces of the vertical parts 224b of the two guides 224. This close contact limits/restricts the movement of the moveable bracket 230 with respect to the guide unit, only allowing rectilinear motion therebetween. Thus, the movable bracket 230 may move rectilinearly without leaning forwards, backwards, rightwards or leftwards.

The tension roller 240 may be rotatably installed between the upper horizontal part 232 and the lower horizontal part 234 of the movable bracket 230. Further, the tension control unit may be connected to the outer surface of the vertical part 236 of the movable bracket 230 and extend behind the outer surface of the vertical part 214 of the fixed bracket 210.

More specifically, the vertical part 214 of the fixed bracket 210 may include an internally threaded hole 216, and a length adjustment screw 250 having a predetermined length may be inserted into the internally threaded hole 216.

The end of the length adjustment screw 250 may be rotatably coupled to the outer surface of the vertical part 236 of the movable bracket 230 using a locking means, such as a locking pin. When the length adjustment screw 250 is rotated, the length adjustment screw 250 moves forwards or backwards along the internally threaded hole 216 of the fixed bracket 210, and rectilinearly moves the movable bracket 230 forwards or backwards.

Further, a plurality of guide holes 218 may be formed in the fixed bracket 210 at locations spaced apart from the internally threaded hole 216 at predetermined intervals. A guide rod 252 having a predetermined length may movably pass through each of the guide holes 218. The ends of the guide rods 252 may be securely mounted to the outer surface of the vertical part 236 of the movable bracket 230. When the movable bracket 230 moves forwards or backwards, the guide rods 252 move rectilinearly along the respective guide holes 218 of the fixed bracket 210. Thus, the guide rods 252 may function as subsidiary means for guiding the rectilinear movement of the movable bracket 230, so that the movable bracket 230 can more stably execute rectilinear movement without leaning.

When one of the timing belts 150, 152, 154 and 156 loses tension and becomes loose and requires adjustment, the length adjustment screw 250 of an associated tensioner 200 may be rotated such that it is moved forwards to move the tension roller 240 forward to apply additional tension to the corresponding timing belt. Likewise, when the length adjustment screw 250 is moved forwards as described above, the movable bracket 230 is moved forwards along the guide unit. Thus, the tension roller 240, which is rotatably installed in the movable bracket 230, is moved forwards and pushes the loose timing belt, thereby tightening the loose timing belt and providing additional tension to the timing belt.

In this circumstance, a worker may control the moving distance of the tension roller 240 by comparing the tension roller 240 of the subject tensioner 200 with the tension rollers 240 of the other tensioners 200 using the graduations formed on the outer surfaces of the scales 222 of the guide unit of the subject tensioner 200. Thus, the worker can easily execute the timing belt tension adjustment operation. In brief, the movable bracket 230 having the rotatable tension roller 240 may move rectilinearly along the guides 224 of the guide unit without leaning forwards, backwards, rightwards or leftwards, so that the tension roller 240 may execute precise rectilinear movement and may precisely control the tension of the timing belts 150, 152, 154 and 156 as desired.

Figure 10:
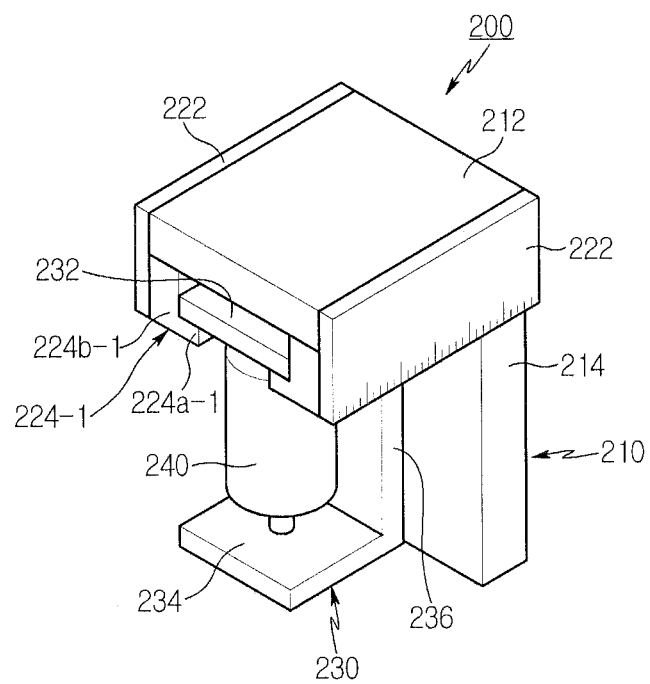
FIG. 10 and FIG. 11 are front perspective views of tensioners for the lift pin driving device in accordance with variations of the embodiment shown in FIG. 6.
Figure 11:
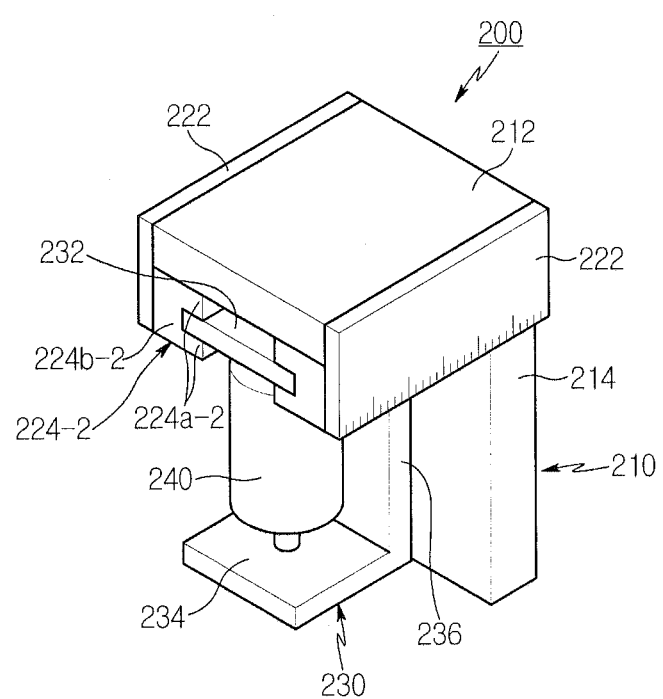

FIG. 10 and FIG. 11 illustrate modifications to the tensioner 200 shown in FIGS. 6-9. As shown in FIG. 10, each of the guides 224-1 of the tensioner 200 may include one horizontal part 224a-1 and one vertical part 224b-1, integrated to have an L-shaped appearance different from the inverted L-shaped appearance of the guide 224 shown in FIG. 6. As shown in FIG. 11, each of the guides 224-2 of the tensioner 200 may instead include two horizontal parts 224a-2 and one vertical part 224b-2 integrated to have a [-shaped appearance.

More specifically, each of the guides 224-1 of the guide unit of the tensioner 200 shown in FIG. 10 may have an L-shaped appearance such that the upper horizontal part 232 of the movable bracket 230 may move rectilinearly forwards or backwards along the upper surfaces of the horizontal parts 224a-1 of the two guides 224-1. Thus, the upper horizontal part 232 of the movable bracket 230 may be stably and rectilinearly moved while maintaining close contact with the upper surfaces of the horizontal parts 224a-1 of the two guides 224-1. Therefore, the movable bracket 230 shown in FIG. 10 can provide for stable rectilinear movement without sagging due to the weight of the bracket 230.

Further, each of the guides 224-2 of the guide unit of the tensioner 200 shown in FIG. 11 may have a [-shaped appearance such that the upper horizontal part 232 of the movable bracket 230 may move forwards or backwards, both along the lower surfaces of the upper horizontal parts 242a-2 of the two guides 224-2 and along the upper surfaces of the lower horizontal parts 242a-2. Thus, the upper horizontal part 232 of the movable bracket 230 may be stably and rectilinearly moved while maintaining close contact both with the lower surfaces of the upper horizontal parts 242a-2 of the two guides 224-2 and with the upper surfaces of the lower horizontal parts 242a-2. Therefore, the movable bracket 230 shown in FIG. 11 may provide for stable rectilinear movement without sagging due to the weight of the moveable bracket 230.

Figure 12:
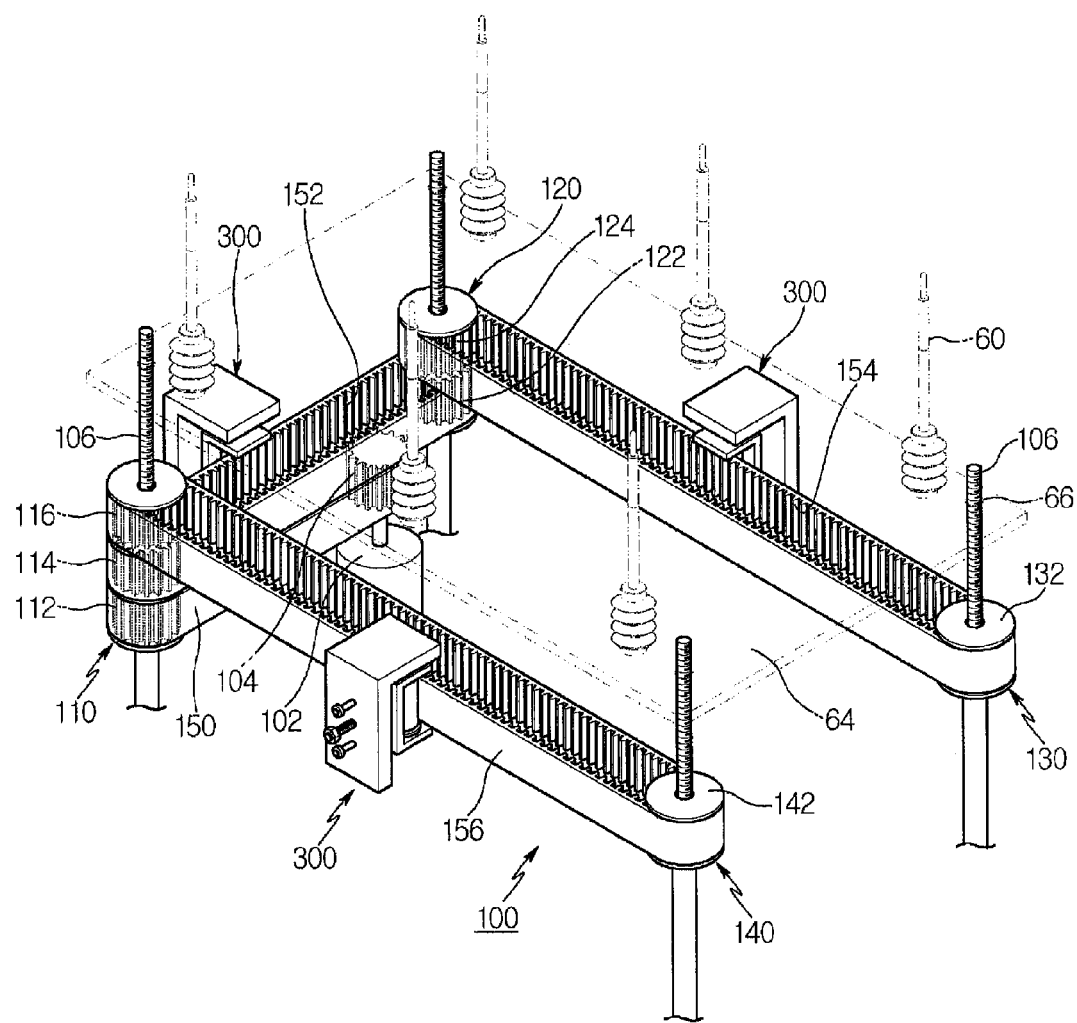
FIG. 12 is a perspective view of a lift pin driving device having a tensioner in accordance with another embodiment as broadly described herein.
Figure 13:
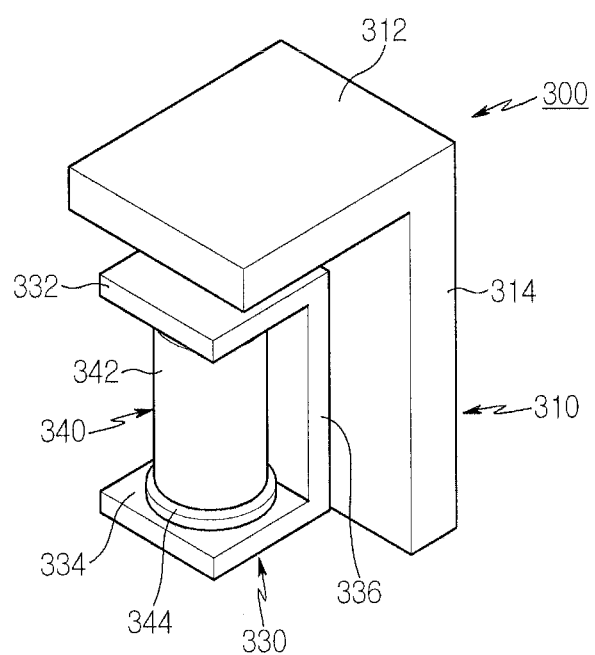
FIG. 13 is a front perspective view of a tensioner for a lift pin driving device shown in FIG. 12.
Figure 14:
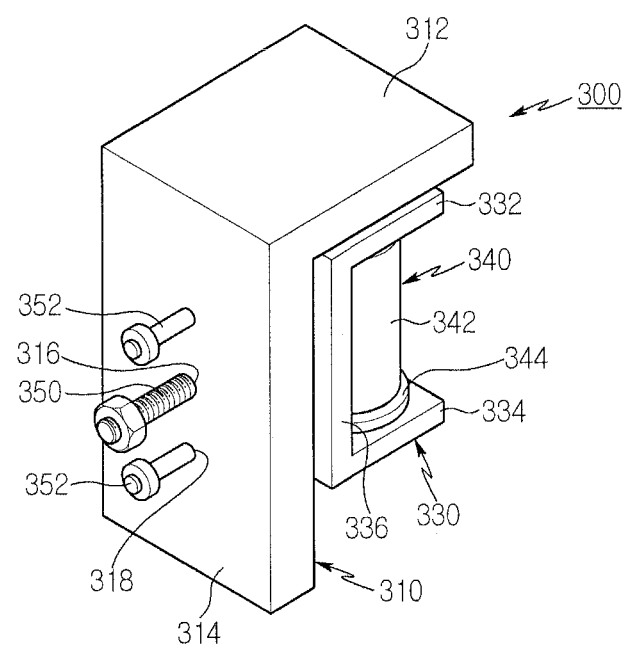
FIG. 14 is a rear perspective view of the tensioner shown in FIG. 13.
Figure 15:
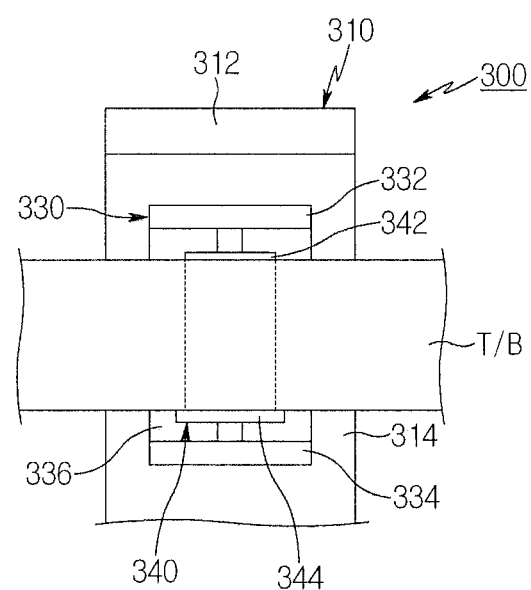
FIG. 15 is a front view of the tensioner shown in FIG. 13.

FIG. 12 is a perspective view of a lift pin driving device having a tensioner in accordance with a second embodiment as broadly described herein. FIGS. 13 through 15 are perspective views of the tensioner shown in FIG. 12.

As noted previously, if the timing belts 150, 152, 154 and 156 operate for an extended period of time, they may lose their tension and become loose due to wear and other material characteristics. Thus, the lift pin driving device shown in FIG. 12 may include a tensioner 300 for maintaining a desired tension in the timing belts 150, 152, 154 and 156.

As shown in FIG. 12, a plurality of tensioners 300 may be closely placed around respective timing belts 150, 152, 154 and 156. Each of the tensioners 300 may include a fixed bracket 310, a movable bracket 330 positioned inside the fixed bracket 310 to be movable forwards and backwards, a tension control unit for moving the movable bracket 330 forwards and backwards, and a tension roller 340 rotatably installed in the movable bracket 330.

The fixed bracket 310 may include a horizontal part 312 and a vertical part 314 which may be integrated to have an inverted L-shaped appearance. The fixed bracket 310 may be securely mounted to a support member (not shown). The movable bracket 330 may include an upper horizontal part 332, a lower horizontal part 334 and a vertical part 336, which may be integrated to have a [-shaped appearance.

The tension roller 340 may be rotatably installed between the upper horizontal part 332 and the lower horizontal part 334 of the movable bracket 330. A tension control unit for rectilinearly moving the movable bracket 330 may be connected to the outer surface of the vertical part 336 of the movable bracket 330 and may extend behind the outer surface of the vertical part 314 of the fixed bracket 310.

More specifically, the vertical part 314 of the fixed bracket 310 may include an internally threaded hole 316, and a length adjustment screw 350 having a predetermined length may be inserted into the internally threaded hole 316. The end of the length adjustment screw 350 may be rotatably coupled to the outer surface of the vertical part 336 of the movable bracket 330 using a locking means, such as a locking pin. Thus, when the length adjustment screw 350 is rotated, the length adjustment screw 350 is moved forwards or backwards along the internally threaded hole 316 of the fixed bracket 310, and rectilinearly moves the movable bracket 330 forwards or backwards.

A plurality of guide holes 318 may be formed in the fixed bracket 310 at locations spaced apart from the internally threaded hole 316 at predetermined intervals. A guide rod 352 having a predetermined length may movably pass through each of the guide holes 318. The ends of the guide rods 352 may be securely mounted to the outer surface of the vertical part 336 of the movable bracket 330. When the movable bracket 330 is moved forwards or backwards, the guide rods 352 may move rectilinearly along the respective guide holes 318 of the fixed bracket 310. Thus, the guide rods 352 guide the rectilinear movement of the movable bracket 330 such that the movable bracket 330 may more stably execute rectilinear movement without leaning.

When one of the timing belts 150, 152, 154 and 156 loses tension and becomes loose and it is required to tighten the loose timing belt, the length adjustment screw 350 of an associated tensioner 300 may be rotated such that it is moved forwards. When the length adjustment screw 350 is moved forwards, the movable bracket 330 is also moved forwards. Thus, the tension roller 340, which is rotatably installed in the movable bracket 330, is moved forwards and pushes on the loose timing belt, thereby tightening and providing additional tension to the loose timing belt and producing the desired tension.

The timing belts 150, 152, 154 and 156 may be relatively long, and thus the timing belts 150, 152, 154 and 156 may sag when they lose tension and become loose. When the timing belts 150, 152, 154 and 156 sag, they cannot reliably transmit power between the pulleys 110, 120, 130 and 140. This may cause the pulleys 110, 120, 130 and 140 to rotate at different speeds.

When the rotating speeds of the pulleys 110, 120, 130 and 140 are different from each other, the ball screws 106 may rotate at different rates, causing the pin plate 64 to move upwards or downwards without being maintained precisely horizontal, and causing the lift pins 60 and substrate S positioned thereon to also move upwards or downwards without being horizontal. Thus, the substrate S may be damaged, and it may be difficult to conduct high quality substrate treatment. To prevent the timing belts from sagging, a sagging prevention part 344 may be provided around the lower end of the tension roller 340 of each of the tensioners 300.

As shown in FIGS. 13 through 15, the tension roller 340 may include a roller part 342 which comes into close contact with part of the timing belt 150, 152, 154, 156, and a sagging prevention part 344 provided around the lower end of the roller part 342 and having an outer diameter larger than that of the roller part 342. A length of the roller part 342 may be slightly greater than or equal to the width of the timing belt 150, 152, 154, 156, and the lower edge of the timing belt 150, 152, 154 and 156 can be supported by the sagging prevention part 344. As the timing belts 150, 152, 154 and 156 rotate while also maintaining close contact with the roller parts 342 of the respective tension rollers 340, the lower edges of the timing belts 150, 152, 154 and 156 may be supported by the sagging prevention parts 344 of the respective tension rollers 340, thus preventing the timing belts 150, 152, 154 and 156 from sagging.

Figure 16:
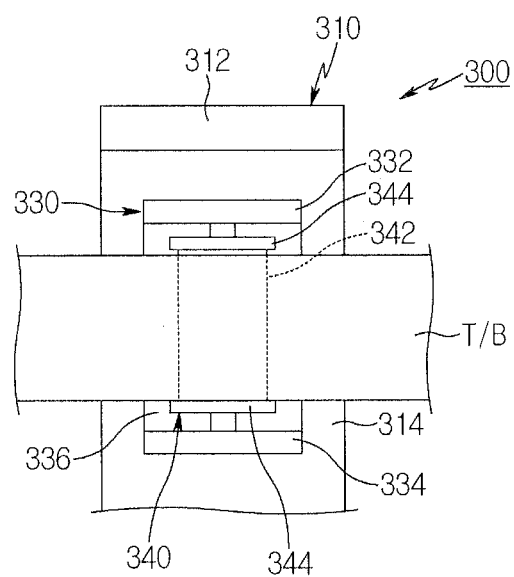
FIG. 16 is a front view of a tensioner in accordance with a variation of the embodiment shown in FIG. 12.

As shown in FIG. 16, the sagging prevention part 344 of the tension roller 340 may include two sagging prevention parts 344 provided around both the upper and the lower ends of the roller part 342 such that the timing belt may pass over the roller part 342 between the two sagging prevention parts 344. The two sagging prevention parts 344 may guide the movement of the timing belt 150, 152, 154 and 156 and prevent the timing belt 150, 152, 154 and 156 from sagging.

Figure 17:
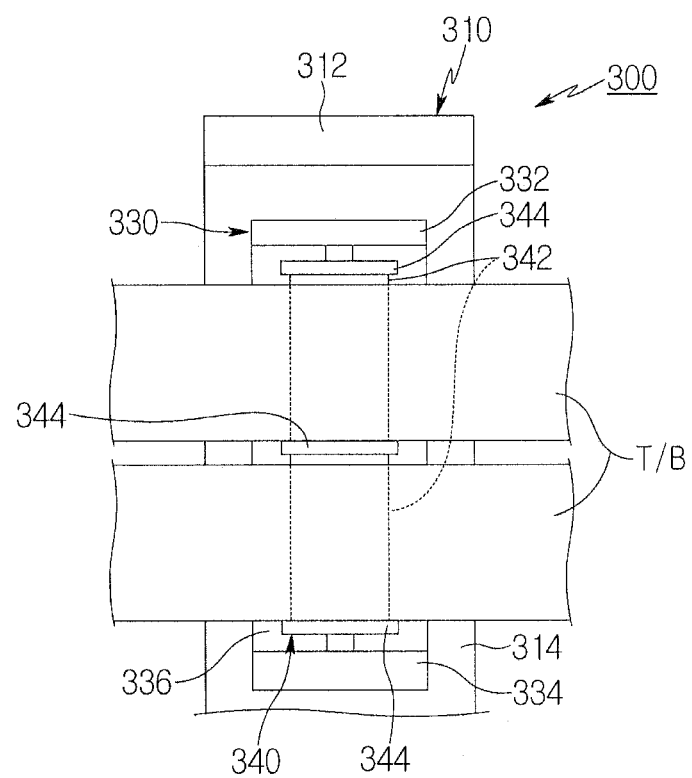
FIG. 17 and FIG. 18 are front perspective views of tensioners for the lift pin driving device in accordance with further variations of the embodiment shown in FIG. 12.

FIG. 17 is a front view of a tensioner in which the roller part 342 of the tension roller 340 is configured as a two-stage structure including two roller parts 342, with a sagging prevention part 344 provided around the lower end of each of the two roller parts 342.

More specifically, the first stage pulley 112 of the first pulley 110 may be connected to the drive pulley 104 of the drive motor 102 by the first timing belt 150. Further, the second stage pulley 114 of the first pulley 110 may be connected to the first stage pulley 122 of the second pulley 120 by the second timing belt 152. The first timing belt 150 and the second timing belt 152 may extend around the same axis. When the timing belt to be tensioned by the tensioner 300 has this two-stage structure, the tension roller 340 of the 300 may also have a two-stage structure including two roller parts 342, with a sagging prevention part 344 provided around the lower end of each of the two roller parts 342, as shown in FIG. 17. The tensioner 300 having the two roller parts 342 with respective sagging prevention parts 344 may prevent the sagging of the timing belt having the two-stage structure.

Figure 18:
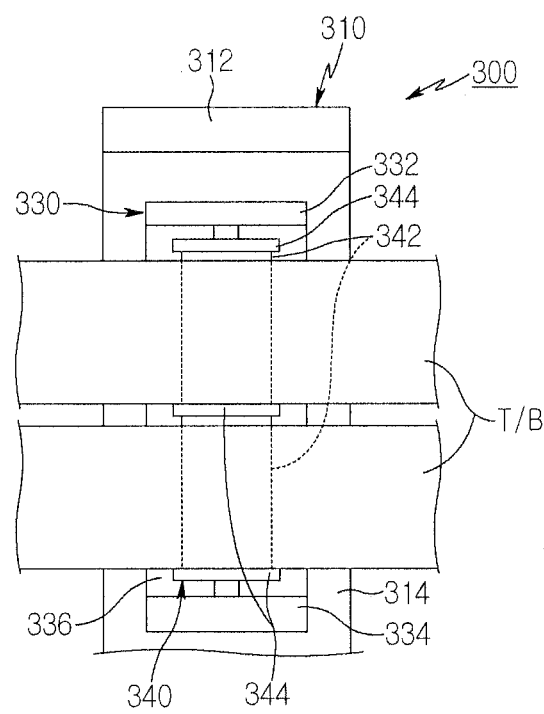

In a tension roller 340 having a two-stage structure with two roller parts 342, sagging prevention parts 344 may be provided around the upper and lower ends of each of the two roller parts 342 such that two timing belts pass over the two roller parts 342 between the sagging prevention parts 344, as shown in FIG. 18. The sagging prevention parts 344 guide the movement of the timing belts and prevent sagging of the timing belts.

Thus, when the timing belt to be tensioned by the tensioner 300 has a two or more-stage structure, the number of roller parts of the tension roller may be set to be equal to the number of stages of the timing belt, and the number of the sagging prevention parts may be one greater than the number of roller parts. In this manner, although a plurality of belts of the multi-stage timing belt may extend around the same axis, it may be possible to prevent the sagging of the timing belts.

Figure 19:
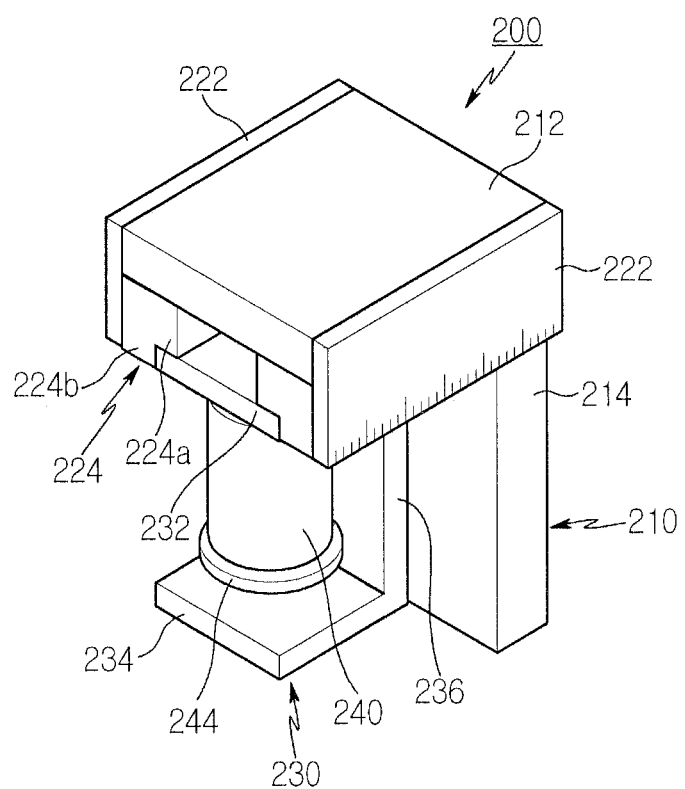
FIG. 19 is a front perspective view of a tensioner for a lift pin driving device in accordance with another embodiment as broadly described herein.

FIG. 19 is a front perspective view of a tensioner used in a lift pin driving device in accordance with a third embodiment as broadly described herein.

In the tensioner 200 shown in FIG. 19, the sagging prevention part 244 of the second embodiment is combined with the construction of the first embodiment, which includes the tension roller 240, the movable bracket 230 to which the tension roller 240 is rotatably mounted, the guide unit 224 which guides the movable bracket 230 such that the movable bracket 230 may move rectilinearly without leaning, the fixed bracket 210, including the guide unit, and the tension control unit for rectilinearly moving the movable bracket 230 relative to the fixed bracket 210.

The tensioner according to the first embodiment or the tensioner according to the second embodiment may be separately provided. Alternatively, the tensioner according to the third embodiment, which is a combination of the construction of the tensioner according to the first embodiment with the construction of the tensioner according to the second embodiment, may be provided together. Further, the tensioner according to the third embodiment may be modified in the same manner as described for the first and second embodiments.

A lift pin driving device and an FPD manufacturing apparatus having the device as embodied and broadly described herein, can precisely move all of the lift pins upwards or downwards at the same time using a single motor, thus easily controlling the motor and precisely moving the lift pins upwards or downwards.

A lift pin driving device and an FPD manufacturing apparatus having the device as embodied and broadly described herein, in which the single motor is disposed on the peripheral region of a pin plate rather than in the central region of a space below a chamber body, enables the layout of the space below the chamber body to be arranged in a variety of ways, and reduces the cost of the equipment, thus reducing the production cost of products.

A lift pin driving device and an FPD manufacturing apparatus having the device as embodied and broadly described herein, in which a tensioner, used for controlling the tension of a timing belt, which is a power transmission unit connected to the single motor and is driven by the motor, is configured to execute precise rectilinear movement without twisting and to prevent the sagging of the timing belt, thus precisely controlling the tension of the timing belt and allowing all of the lift pins to be precisely moved upwards or downwards at the same time.

A lift pin driving device as embodied and broadly described herein may include a support unit for supporting a substrate thereon; a plurality of lift pins, arranged such that they pass through the support unit, the lift pins moving the substrate upwards or downwards; a pin plate, on which the lift pins are mounted and which moves the lift pins upwards or downwards; a drive unit for moving the pin plate upward or downwards, the drive unit comprising a drive motor and a plurality of pulleys connected to the drive motor through a power transmission unit and operated in conjunction with the drive motor; and a tensioner for controlling the tension of the power transmission unit.

In certain embodiments, the tensioner may include a tension roller placed such that it is in close contact with the power transmission unit, the tension roller being movable forwards and backwards; a movable bracket, in which the tension roller is rotatably supported; a guide unit for guiding the movement of the movable bracket such that the movable bracket can be rectilinearly moved without leaning forwards, backwards, rightwards or leftwards; a fixed bracket, in which the guide unit is provided; and a tension control unit for rectilinearly moving the movable bracket forwards or backwards relative to the fixed bracket.

The fixed bracket of the tensioner may include a horizontal part and a vertical part, which are integrated to form an inverted L-shaped appearance, and the guide unit of the tensioner may include a scale provided on each side surface of the horizontal part of the fixed bracket, and guides formed parallel along opposite sides of the lower surface of the horizontal part the fixed bracket.

In certain embodiments, each of the guides of the guide unit may include a horizontal part and a vertical part which are integrated to have an inverted L-shaped appearance. In alternative embodiments, each of the guides of the guide unit may include a horizontal part and a vertical part which are integrated to have an L-shaped appearance, or each of the guides of the guide unit may comprise an upper horizontal part, a vertical part and a lower horizontal part which are integrated to have a [-shaped appearance.

The scale may include a graduation on an outer surface thereof.

The power transmission unit may include a timing belt.

In alternative embodiments, the tensioner may include a tension roller placed such that it is in close contact with part of the power transmission unit, the tension roller being movable forwards or backwards and supporting a part of the power transmission unit so as to prevent the power transmission unit from sagging; a movable bracket, in which the tension roller is rotatably supported; a fixed bracket, in which the movable bracket is provided so as to be movable forwards or backwards; and a tension control unit for rectilinearly moving the movable bracket forwards or backwards relative to the fixed bracket.

In certain embodiments, the tension roller may include a roller part, placed such that it is in close contact with the part of the power transmission unit; and a sagging prevention part, provided on the lower part of the roller part and having an outer diameter larger than that of the roller part.

The roller part of the tension roller may be configured to have an n-stage structure, and the sagging prevention part may be configured to have an n-stage structure, and parts of stages of the power transmission unit having an n-stage structure, which are placed along the same vertical axis, may be brought into close contact with the roller part having the n-stage structure.

In alternative embodiments, the tension roller may include a roller part, placed such that it is in close contact with the part of the power transmission unit; and a sagging prevention part, provided on each of upper and lower parts of the roller part and having an outer diameter larger than that of the roller part.

The roller part of the tension roller may be configured to have an n-stage structure, and the sagging prevention part may be configured to have an (n+1)-stage structure, and parts of stages of the power transmission unit having an n-stage structure, which are placed along the same vertical axis, may be brought into close contact with the roller part having the n-stage structure.

A lift pin driving device in accordance with another embodiment as broadly described herein may include a support unit for supporting a substrate thereon; a plurality of lift pins, arranged such that they pass through the support unit, the lift pins moving the substrate upwards or downwards; a pin plate, on which the lift pins are mounted and which moves the lift pins upwards or downwards; a drive unit for moving the pin plate upward or downwards, the drive unit comprising a drive motor and a plurality of pulleys connected to the drive motor through a power transmission unit and operated in conjunction with the drive motor; and a tensioner for controlling the tension of the power transmission unit, the tensioner including a tension roller placed such that it is in close contact with the power transmission unit, the tension roller being movable forwards and backwards and having a sagging prevention part for supporting part of the power transmission unit so as to prevent the power transmission unit from sagging; a movable bracket, in which the tension roller is rotatably supported; a guide unit for guiding the movement of the movable bracket such that the movable bracket can be rectilinearly moved without leaning forwards, backwards, rightwards or leftwards; a fixed bracket, in which the guide unit is provided; and a tension control unit for rectilinearly moving the movable bracket forwards or backwards relative to the fixed bracket.

An FPD manufacturing apparatus having a lift pin driving device as embodied and broadly described herein may include a chamber body, having a pin passing unit in the lower part thereof; a lower electrode assembly provided in the chamber body to support a substrate thereon, with a plurality of pin passing units formed in the lower electrode assembly; and a lift pin driving device placed in the space below the chamber body and driving a plurality of lift pins provided in the pin passing units of the lower electrode assembly inside the chamber body, thus moving the substrate upwards or downwards.

The chamber body may be provided therein with an upper electrode assembly for spraying process gas, generating plasma, and treating the surface of the substrate.

The lift pin driving device and the FPD manufacturing apparatus having the device as embodied and broadly described herein are configured such that all of the lift pins can be precisely moved upwards or downwards at the same time using one drive motor, so that the motor can be easily controlled to precisely move the lift pins upwards or downwards.

Further, the single drive motor is installed in the peripheral region of the pin plate, and the timing belts of the power transmission unit are arranged along the edge of the lower surface of the pin plate and are coupled to each other, so that the pin plate can be precisely moved upwards or downwards using a single drive motor. Thus, the layout of the space below the chamber body may be constructed in a variety of ways without causing interference between the lift pin driving device and surrounding elements. Therefore, the cost of the equipment may be reduced, thereby reducing the production cost of products.

Further, the tensioner, used for controlling the tension of the timing belts which constitute the power transmission unit for rotating a plurality of ball screws using a single drive motor, can be precisely and rectilinearly moved without leaning forwards, backwards, rightwards or leftwards, and prevents the sagging of the timing belts, thus allowing the ball screws to be moved upwards or downwards at the same speed. Thus, the lift pins can be precisely moved upwards or downwards and prevent damage to the substrate, and the FPD manufacturing apparatus as embodied and broadly described herein can be used to manufacture high quality FPDs.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A lift pin driving device, comprising:
   a support unit configured to receive a substrate thereon;
   a pin plate positioned below the support unit;
   a plurality of lift pins extending upwards from the pin plate so as to pass through a corresponding plurality of holes in the support unit;
   a drive unit configured to move the pin plate and the plurality of lift pins fixed thereto upwards and downwards so as to move a substrate positioned thereon, the drive unit comprising;
      a single drive motor; and
      a plurality of pulleys operably coupled to the single drive motor by a power transmission unit, wherein one of the plurality of pulleys is coupled to the single drive motor and is independently coupled to neighboring pulleys by respective timing belts of the power transmission unit such that rotation of the single drive motor rotates all of the plurality of pulleys in the same direction; and
   a tensioner, comprising a tension roller that maintains rolling contact with the power transmission unit so as to control a tension thereof.

2. The device of claim 1, wherein the tensioner comprises:
   a fixed bracket;
   a moveable bracket slidably coupled to the fixed bracket, wherein the tension roller is rotatably coupled to the moveable bracket and positioned so as to maintain rolling contact with the power transmission unit;
   a guide unit provided with the fixed bracket to guide rectilinear movement of the moveable bracket relative to the fixed bracket; and
   a tension control unit configured to control the rectilinear movement of the moveable bracket relative to the fixed bracket so as to adjust a tension of the power transmission unit.

3. The device of claim 2, wherein the guide unit restricts the movement of the moveable bracket such that the movement of the moveable bracket is limited to a sliding rectilinear movement along a longitudinal direction of the moveable bracket relative to the fixed bracket.

4. The device of claim 2, wherein the fixed bracket comprises a horizontal part extending from a vertical part, and wherein the guide unit comprises a scale provided on opposite side surfaces of the horizontal part of the fixed bracket.

5. The device of claim 4, wherein the guide unit comprises a guide recess provided in a lower surface of the horizontal part of the fixed bracket, wherein the guide recess is configured to slidably couple the moveable bracket to the fixed bracket.

6. The device of claim 5, wherein the guide recess comprises:
   a first guide portion having opposite vertical sides extending downward from the horizontal part of the fixed bracket; and
   a second guide portion having opposite horizontal sides extending outward from respective lowermost ends of the opposite vertical sides of first guide portion, and opposite vertical sides extending downward from ends of its respective horizontal sides such that a width of the second guide portion is greater than a width of the first guide portion, wherein the second guide portion is configured to slidably receive an upper end of the moveable bracket.

7. The device of claim 5, wherein the guide recess comprises first and second guide portions provided on opposite sides of the horizontal part of the fixed bracket with a gap therebetween, wherein the first and second guide portions each include a longitudinal channel extending horizontally along vertical sides thereof such that the longitudinal channels of the first and second guide portions face each other, wherein the longitudinal channels are configured to slidably receive respective edges of the moveable bracket so as to slidably couple the moveable bracket to the fixed bracket.

8. The device of claim 5, wherein the guide recess comprises:
   a first guide portion having opposite vertical sides extending downward from the horizontal part of the fixed bracket, and opposite horizontal sides extending inward from respective lowermost ends of its opposite vertical sides; and
   a second guide portion having opposite vertical sides extending downward from respective ends of the opposite horizontal sides of the first guide portion such that a width of the second guide portion is less than a width of the first guide portion, wherein the first guide portion is configured to slidably receive an upper end of the moveable bracket.

9. The device of claim 4, wherein the moveable bracket comprises:
   an upper horizontal part;
   a lower horizontal part; and
   a vertical part extending from a rear edge of the upper horizontal part to a corresponding rear edge of the lower horizontal part, wherein a first end of the tension roller is rotatably coupled to the upper horizontal part and a second end of the tension roller is rotatably coupled to the lower horizontal part.

10. The device of claim 9, wherein the tension control unit comprises:
    an adjustment screw configured to be threadably engaged through a corresponding hole in the vertical part of the fixed bracket, wherein a distal end of the adjustment screw is configured to contact and exert a force against the vertical part of the moveable bracket so as to slide the moveable bracket within the guide unit of the fixed bracket; and
    at least one guide rod configured to extend through a corresponding at least one guide hole in the vertical part of the fixed bracket, wherein a distal end of the at least one guide rod is configured to contact the vertical part of the moveable bracket, and to support and guide movement of the moveable bracket relative to the fixed bracket.

11. The device of claim 4 wherein the scale includes gradations on an outer surface thereof, wherein the gradations are positioned so as to indicate a position of the moveable bracket relative to the fixed bracket.

12. The device of claim 2, wherein the tension roller includes at least one raised portion that extends radially outward from at least one outer circumferential edge of the tension roller, wherein the at least one raised portion is configured to support an edge of a timing belt of the power transmission unit and to maintain an alignment of the timing belt on the tension roller.

13. The device of claim 2, wherein the tension roller is separated in a central portion thereof by a first raised portion that extends radially outward from an outer circumferential surface of the tension roller, wherein the tension roller is configured to maintain rolling contact with a first timing belt of the power transmission unit on an upper portion of the tension roller above the raised portion, and with a second timing belt of the power transmission unit on a lower portion of the tension roller below the raised portion.

14. The device of claim 13, wherein the tension roller comprises a second raised portion that extends radially outward from a first outer circumferential edge of the tension roller, wherein the first and second raised portions are configured to support respective edges of the first and second timing belts and maintain alignment of the first and second timing belts on the upper and lower portions of the tension roller, respectively.

15. The device of claim 14, further comprising a third raised portion that extends radially outward from a second outer circumferential edge of the tension roller, wherein the first and third raised portions are configured to support respective upper edges of the first and second timing belts, and the first and second raised portions are configured to support respective lower edges of the first and second timing belts, and wherein the first and third raised portions are configured to maintain alignment of the first timing belts on the upper portion of the tension roller, and the first and second raised portions are configured to maintain alignment of the second timing belt on the lower portion of the tension roller.

16. The device of claim 1, wherein the tensioner is coupled to one of the timing belts of the power transmission unit such that the tension roller maintains rolling contact with a surface of the timing belt so as to maintain a predetermined amount of tension in the timing belt.

17. A flat panel display manufacturing apparatus comprising the device of claim 1.

18. A flat panel display (FPD) manufacturing apparatus, comprising:

a chamber body that defines an interior space therein;
a lower electrode assembly provided within the interior space of the chamber body and configured to support a substrate thereon; and
a lift pin driving device positioned below the chamber body, wherein the driving device is configured to move a plurality of lift pins vertically through a plurality of first holes formed in a bottom surface of the chamber body and a corresponding plurality of second holes that extend through the lower electrode assembly so as to raise and lower a substrate positioned on the lower electrode assembly, wherein the lift pin driving device comprises:
a pin plate, wherein lower ends of the plurality of lift pins are fixed to an upper surface of the pin plate;
a drive unit configured to move the pin plate vertically so as to raise and lower the plurality of lift pins fixed thereto through the plurality of first and second holes so as to raise and lower the substrate positioned on the lower electrode assembly, wherein the drive unit comprises:
a single drive motor configured to generate a driving force;
a plurality of pulleys;
a power transmission unit configured to transmit the driving force generated by the single drive motor to one of the plurality of pulleys to rotate the plurality of pulleys, wherein the one of the plurality of pulleys is independently coupled to neighboring pulleys by respective timing belts of the power transmission unit such that rotation of the single drive motor rotates all of the plurality of pulleys in the same direction; and
a plurality of ball screws threadably engaged with the pin plate and respectively fixed to the plurality of pulleys such that the pulleys and the ball screws rotate together to move the pin plate vertically based on a direction of rotation of the pulleys and ball screws; and
a tensioner coupled to the power transmission unit and configured to control an amount of tension in the power transmission unit, wherein the tensioner comprises:
a fixed bracket;
a moveable bracket slidably coupled to a guide unit of the fixed bracket;
a roller rotatably coupled to the moveable bracket and positioned so as to maintain rolling contact with a surface of the power transmission unit; and
a tension control unit configured to slide the moveable bracket within the guide unit of the fixed bracket so as to adjust a position of the roller against the surface of the power transmission unit and adjust an amount of tension in the power transmission unit.

* * * * *

UNITED STATES PATENT AND TRADEMARK OFFICE
CERTIFICATE OF CORRECTION

| | |
|---|---|
| PATENT NO. | : 8,603,249 B2 |
| APPLICATION NO. | : 11/874379 |
| DATED | : December 10, 2013 |
| INVENTOR(S) | : Jong Sun Kim, Chang Keun Lee and Won Ki Jeong |

It is certified that error appears in the above-identified patent and that said Letters Patent is hereby corrected as shown below:

Title Page, item (73) Assignee should read
ADP ENGINEERING CO., LTD., Seongnam-si (KR)

Signed and Sealed this
Fifth Day of January, 2016

Michelle K. Lee
*Director of the United States Patent and Trademark Office*